United States Patent [19]

Kuwabara

[11] Patent Number: 5,189,496
[45] Date of Patent: Feb. 23, 1993

[54] LIGHT-EMITTING DIODE WITH CURRENT-BLOCKING

[75] Inventor: Masayuki Kuwabara, Kanagawa, Japan

[73] Assignee: Eastman Kodak Company, Rochester, N.Y.

[21] Appl. No.: 809,892

[22] Filed: Dec. 18, 1991

[30] Foreign Application Priority Data

Dec. 27, 1990 [JP] Japan .................. 2-408357

[51] Int. Cl.⁵ ........................... H01L 33/00
[52] U.S. Cl. ..................... 257/79; 372/45; 372/46; 257/88; 257/91; 257/94; 257/101
[58] Field of Search ............ 357/17, 45, 16; 372/46, 372/45

[56] References Cited

U.S. PATENT DOCUMENTS 4,477,824 10/1984 Dutt ............................ 357/17
4,719,497 1/1988 Tsai ............................ 357/17

FOREIGN PATENT DOCUMENTS

| | | | |
|---|---|---|---|
| 57-148383 | 9/1982 | Japan | 357/17 |
| 61-220484 | 9/1986 | Japan | 357/17 |
| 1137679 | 5/1989 | Japan | 357/17 |

*Primary Examiner*—William Mintel

[57] ABSTRACT

A surface emitting light-emitting diode has in a body of a semiconductor material a light-emitting p-n junction, a first electrode on a portion of one surface of the body and a second electrode on another surface of the body opposite the one surface. A current-block region is provided in the body under the first electrode and between the first electrode and the p-n junction. This suppresses light emission from beneath the first electrode and applies current injection only to regions where it is effective for producing surface emission so as to improve the emission efficiency of the diode.

10 Claims, 2 Drawing Sheets

LIGHT-EMITTING DIODE WITH CURRENT-BLOCKING

FIELD OF THE INVENTION

The present invention relates to a light-emitting diode, and, more particularly, to a surface emitting type light-emitting diode.

BACKGROUND OF THE INVENTION

An advantage of light-emitting diode (LED) arrays, which comprise a plurality of p-n junction light-emitting diodes arrayed on a substrate, is that they enable image information and the like to be processed relatively easily by electrically controlling the individual light-emitting diodes. As such, improved LED arrays have been proposed, together with various applications.

One application for such LED arrays is in printers used as information output devices. There is a need for printers that can print faster and produce higher density output. One way of meeting this need is to use light-emitting diode arrays as a light source. Laser printers, which employ a laser light source, and LED printers, which employ an LED array as the light source, are two examples of non-impact optical printers. A laser printer requires the use of a mechanical mechanism such as a rotating polygonal mirror for the scanning laser beam, and a correspondingly complex optical system. An LED printer, on the other hand, only requires that the light-emitting diodes that constitute the LED array are controlled to switch them on and off. This enables LED printers to be smaller, faster and more reliable than laser printers.

FIG. 1 is a cross-sectional view of a conventional (prior art) LED 10 for use in an LED printer or the like. LED 10 comprises a substrate 11 of n-type conductivity GaAs having on a surface thereof a layer 19 of n-type conductivity GaAsP. The layer 19 may be formed on the substrate 11 by vapor-phase epitaxy (VPE). On the layer 19 is a masking layer 15 of SiN having an opening therethrough to expose a portion of the layer 19. A p-type conductivity diffusion region 18 extends into the layer 19 under the opening in the masking layer 15. The diffusion region 18 is formed by diffusing a p-type conductivity dopant, such as zinc, into the layer 19 through the opening in the masking layer 15. A light emission region is formed by the p-n junction formed by the interface between the layer 19 and the diffusion region 18. A conductive electrode 16 is on a surface of the diffusion region 18 within the opening in the masking layer 15, and a conductive electrode 17 is on a surface of the substrate 11 opposite the layer 19.

A problem with this type of surface emitting type LED is that most of the light is produced below the electrode 16 where the current density is at its highest. However, this light is reflected by the electrode 16 and therefore is not emitted externally. This greatly decreases the external quantum efficiency of the LED 10.

SUMMARY OF THE INVENTION

The present invention provides a surface emitting light-emitting diode in which a very high emission efficiency is achieved by suppressing light emission below the electrode and applying current injection only to regions where it is effective for producing external emission.

The present invention is directed to a light-emitting diode which is formed of a body of a semiconductor material having a p-n junction therein which is adapted to emit light when a potential is applied thereacross. An electrode is on the body and extends across a portion of the p-n junction. A current-blocking region is provided in the body beneath the electrode. In this light-emitting diode, the current blocking region below the electrode prevents light from being generated in the body under the electrode.

The invention will be better understood from the following more detailed description taken with the accompanying drawings.

DETAILED DESCRIPTION

Figure 1:
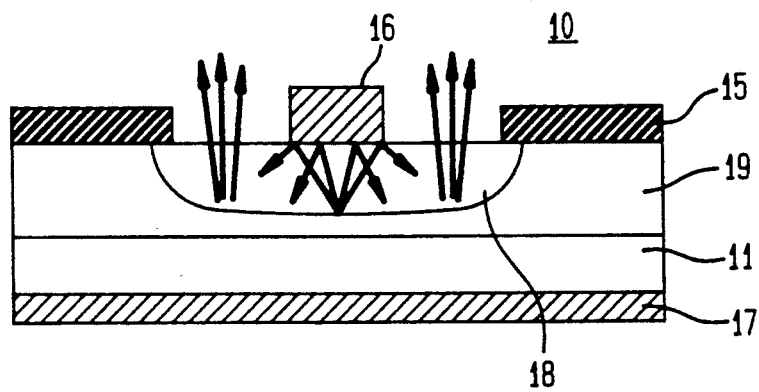
FIG. 1 is a cross-sectional view of a conventional (prior art) light-emitting diode.
Figure 2:
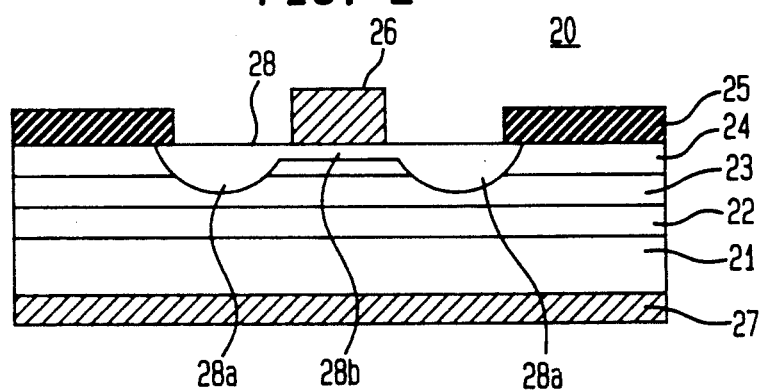
FIG. 2 is a cross-sectional view of a first embodiment of a light-emitting diode in accordance with the present invention.

Referring now to FIG. 2, there is shown a cross-sectional view of a light-emitting diode 20 in accordance with the present invention. Light-emitting diode 20 comprises a substrate 21 of n-type conductivity GaAs having on a surface thereof a first layer 22 of n-type conductivity AlGaAs. On the first layer 22 is a second layer 23 of p-type conductivity AlGaAs. A third layer 24 of n-type conductivity AlGaAs is on the second layer 23. The first, second and third layers 22, 23 and 24 may be deposited in succession on the substrate 21 by molecular beam epitaxy (MBE) and form with the substrate 21 a body of semiconductor material. A masking layer 25 of SiN is on the third layer 24 and has an opening therethrough to expose a portion of the third layer 24.

A p-type conductivity diffusion region 28 is in portions of the third and second layers 24 and 23 under the opening in the masking layer 25. The diffusion region 28 has an outer portion 28a which extends through the n-type third layer 24 and into the p-type second layer 23, and has a central portion 28b which extends only into the n-type third layer 24. The diffusion region 28 is formed by diffusing a p-type conductivity dopant, such as zinc, into the third and second layers 24 and 23 through the opening in the masking layer 25. The diffusion region 28 is formed by a two step diffusion wherein the deeper portion 28a is formed first and then the shallower portion 28b is formed within the deeper portion 28a. A zinc diffusion can be achieved by using sputtering or other such technique to form a ZnO layer containing the diffusion source zinc on the SiN masking layer 25, and heating the device to a temperature of about 650° C. to 800° C. for several hours to achieve thermal diffusion of the zinc.

A first electrode 26 is on the shallower central portion 28b of the diffusion region 28 and a second electrode 27 is on a surface of the substrate 21 opposite the first layer 22. If desired, a highly conductive p-type (p+type) contact layer (not shown) may be provided over the diffusion region 28 with the first electrode 26 being on the contact layer.

Since the central portion 28b of the diffusion region 28 extends only into the n-type third layer 24, the region directly below the first electrode 26 assumes, in sequence from the surface of the third layer 24, a reverse-bias p-n-p-n-n configuration when a voltage is applied across the electrodes 26 and 27. Accordingly, no current injection takes place and thereby there is no resulting light emission in this region. However, since the outer region 28a of the diffusion region 28 extends into the p-type second layer 23, the configuration of the layers not under the first electrode 26 is p-p-n. Thus, when a forward bias potential is applied across the electrodes 26 and 27, current passes through the portion of the diode 20 outside the first electrode 26 and across the p-n junction between the first and second layers 22 and 23. This results in the emission of light in the portion of the diode 20 outside of the first electrode 26. This emitted light exits diode 20 without being reflected by the first electrode 26.

Thus, the light-emitting diode 20 provides a diode which exhibits very high emission efficiency by providing a current blocking layer with a reverse-bias structure under the first electrode 26 to suppress light emission beneath the first electrode 26. In addition, the light generated in the diode 20 outside the first electrode 26 is emitted efficiently from the portion 28a of the diffusion region 28 that is not beneath the first electrode 26.

Moreover, by selecting appropriate composition ratios for the Al, Ga, As constituting the AlGaAsP first layer 22, the AlGaAs second layer 23 and the AlGaAs third layer 24 (reducing the ratio of the Al in the AlGaAs second layer 23), the bandgap of the AlGaAs third layer 24 can be set to be larger than the bandgap of the AlGaAs second layer 23. This provides a further increase in the external emission efficiency by preventing the AlGaAs third layer 24 from absorbing the light produced at the p-n junction.

Figure 3:
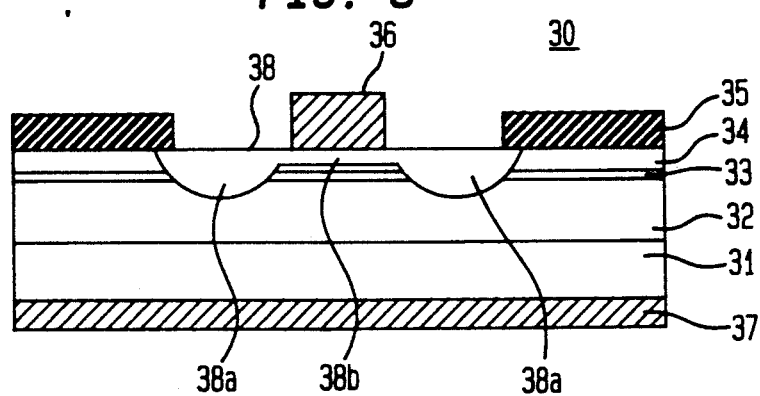
FIG. 3 is a cross-sectional view of a second embodiment of a light-emitting diode in accordance with the present invention.

Referring now to FIG. 3, there is shown a cross-sectional view of a light-emitting diode 30 in accordance with the present invention. Light-emitting diode 30 is similar to the light-emitting diode 20 shown in FIG. 2 except that the p-n junction is formed by thermal diffusion instead of between two epitaxially grown layers. The light-emitting diode 30 comprises a substrate 31 of n-type conductivity GaAs having on a surface thereof a first layer 32 of n-type conductivity AlGaAs. On the first layer 32 is a second layer 33 of p-type AlGaAs followed by a third layer 34 of n-type conductivity AlGaAs. The substrate 31, first layer 32, second layer 33 and third layer 34 provide a semiconductor body. A masking layer 35 of SiN is on the third layer 34 and has an opening therethrough to expose a portion of the third layer 34. A p-type conductivity diffusion region 38 extends into the third, second and first layers 34, 33 and 32, under the opening in the masking layer 35. The diffusion region 38 is formed by diffusing a p-type conductivity dopant, such as zinc, into the layers. The diffusion region 38 has an outer portion 38a which extends through the third and second layers 34 and 33 and into the first layer 32. Thus, a p-n junction is formed between the outer portion 38a of the diffusion region 38 and the first layer 32. The diffusion region 38 has a central portion 38b which extends only into the third layer 34 to form a current blocking junction therewith.

A first electrode 36 is on the central portion 38b of the diffusion region 38 and a second electrode 37 is on the surface of the substrate 31 opposite the first layer 32. If desired, a highly conductive p-type conductivity (p+ type) contact layer may be provided on the diffusion region 38.

As in the light-emitting diode 20 shown in FIG. 2, the region below the first electrode 36 is provided with a current-blocking region having a reverse-bias p-n-p-n-n configuration whereby light emission from this region is suppressed. However, the p-n junction formed between the outer portion 38a of the diffusion region 38 and the n-type second layer 32 generates light that is externally emitted without being reflected by the first electrode 36. As in the light-emitting diode 20, the bandgap of the AlGaAs third layer 34 can be set to a larger value than the AlGaAs second layer 33 to provide a further increase in the external emission efficiency by suppressing absorption of the light.

Figure 4:
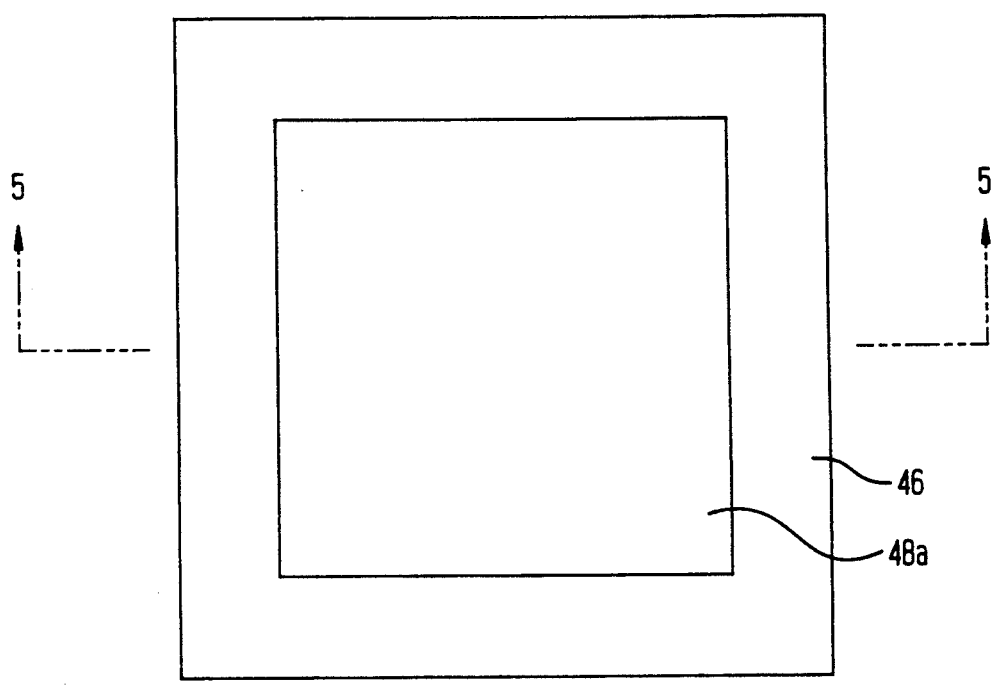
FIG. 4 is a top plan view of a third embodiment of a light-emitting diode in accordance with the present invention.
Figure 5:
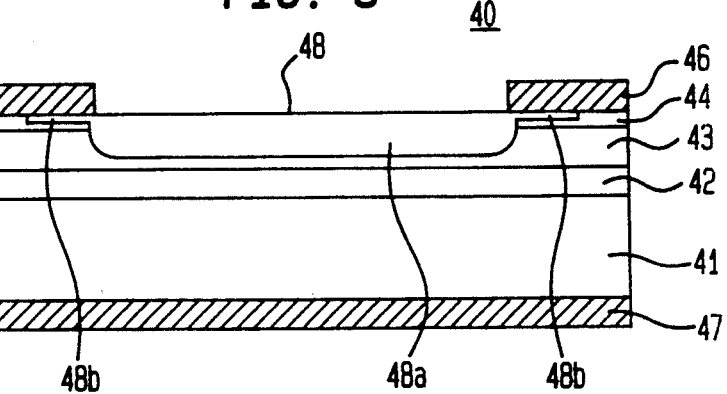
FIG. 5 is a cross-sectional view taken along a dashed line 5—5 of FIG. 4.

Referring now to FIGS. 4 and 5, there is shown a top plan view and a sectional view, respectively, of a light-emitting diode 40 in accordance with the present invention. The light-emitting diode 40 comprises a substrate 41 of n-type conductivity GaAs having on a surface thereof a first layer 42 of n-type conductivity AlGaAs. On the first layer 42 is a second layer 43 of p-type conductivity AlGaAs followed by a third layer 44 of n-type conductivity AlGaAs. A p-type conductivity diffusion region 48 extends into the third and second layers 44 and 43. The diffusion region 48 has a central portion 48a which extends through the third layer 44 and into the second layer 43, and has a narrow outer portion 48b which extends only into a portion of the third layer 44. The diffusion region may be formed by diffusing a p-type conductivity dopant, such as zinc, into the second and third layers 43 and 44. A first electrode 46 is on the outer portion 48b of the diffusion region 48, and, as shown in FIG. 4, extends around the central portion 48b. A second electrode 47 is on a surface of the substrate 41 opposite the first layer 42.

As in the light-emitting diodes 20 and 30, when a voltage is applied across the electrodes 46 and 47, a current-blocking region with a reverse-bias configuration is provided beneath the first electrode 46 to suppress emission beneath the first electrode 46. However, the forward-bias structure at the central portion 48a of the diffusion region 48 results in current injection over the whole of the central region 48a. This makes it possible to produce a continuous emission pattern. The series resistance of the light-emitting diode 40 can be reduced by increasing the contact area between the first electrode 46 and the diffusion region 48.

It is to be appreciated and understood that the specific embodiments of the invention are merely illustrative of the general principles of the invention. Various modifications may be made consistent with the principles set forth. For example, the various layers of the light-emitting diodes can be made of other suitable group III-V materials.

What is claimed is:

1. A light-emitting diode comprising:
    a body of a semiconductor material having a p-n junction therein which is adapted to emit light when a potential is applied thereacross;
    said body comprising at least two layers of opposite conductivity type;
    an electrode on said body extending across a portion of the p-n junction;

a current-blocking region in said body beneath the electrode to prevent light from being generated in the substrate under the electrode; and wherein a diffusion region is of a conductivity type opposite that of one of said layers, a first portion of the diffusion region is under the electrode and extends only into the one layer and a second portion of the diffusion region is outside the electrode and extends into the other layer.

2. The light-emitting diode of claim 1 in which the second portion of the diffusion region is around the first portion so that the light generated in the portion of the layers outside the electrode is emitted from the diode around the electrode.

3. The light-emitting diode of claim 1 in which the first portion of the diffusion region is around the second portion and the electrode is on the first portion and around the second portion so that light generated in the layers is emitted from the diode within the electrode.

4. A light-emitting diode comprising:
a substrate of a semiconductor material of a first conductivity type;
a first layer of a semiconductor material of the first conductivity type on a surface of the substrate;
a second layer of a semiconductor material of a second conductivity type opposite that of the first conductivity type on the first layer;
a third layer of a semiconductor material of the first conductivity type on the second layer;
a diffusion region of the second conductivity type having a first portion extending only into the third layer and a second portion extending at least into the second layer;
a first electrode on the third layer over only the first portion of the diffusion region; and
a second electrode on a surface of the substrate opposite the layers;
the first portion of the diffusion region forming with the third layer a current-blocking region to prevent light from being generated in the layers directly under the first electrode.

5. The light-emitting diode of claim 4 in which the second portion of the diffusion region extends through the third layer and only into the second layer.

6. The light-emitting diode of claim 4 in which the second portion of the diffusion region extends through the third and second layers and into the first layer.

7. The light-emitting diode of claim 4 in which the second portion of the diffusion region is around the first portion so that light generated in the portion of the layers outside the first electrode is emitted from the diode around the first electrode.

8. The light-emitting diode of claim 4 in which the first portion of the diffusion region is around the second portion and the first electrode is on the first portion and around the second portion of the diffusion region so that light generated in the layers is emitted from the diode within the first electrode.

9. The light-emitting diode of claim 6 in which the first conductivity type is n-type and the second conductivity type is p-type.

10. The light-emitting diode of claim 4 in which the third layer is of a semiconductor material having a bandgap greater than that of the semiconductor material of the second layer.

* * * * *